(12) United States Patent
Lee

(10) Patent No.: US 10,790,263 B2
(45) Date of Patent: Sep. 29, 2020

(54) INTEGRATED CIRCUIT DIE HAVING BACKSIDE PASSIVE COMPONENTS AND METHODS ASSOCIATED THEREWITH

(71) Applicant: Intel Corporation, Santa Clara, CA (US)

(72) Inventor: Kevin J. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/287,915

(22) Filed: Feb. 27, 2019

(65) Prior Publication Data

US 2019/0198481 A1    Jun. 27, 2019

Related U.S. Application Data

(63) Continuation of application No. 15/503,377, filed as application No. PCT/US2014/057807 on Sep. 26, 2014, now Pat. No. 10,224,309.

(51) Int. Cl.
*H01L 25/00* (2006.01)
*H01L 25/065* (2006.01)
(Continued)

(52) U.S. Cl.
CPC ........ *H01L 25/0652* (2013.01); *H01L 23/481* (2013.01); *H01L 23/5223* (2013.01);
(Continued)

(58) Field of Classification Search
None
See application file for complete search history.

(56) References Cited

U.S. PATENT DOCUMENTS 7,605,458 B1 * 10/2009 Rahman ................ H01L 23/642
257/686
8,610,281 B1    12/2013 Nguyen et al.
(Continued)

FOREIGN PATENT DOCUMENTS

CN        102130063 A       7/2011
CN        103367244 A      10/2013
(Continued)

OTHER PUBLICATIONS

Office Action dated Aug. 27, 2019 for Japanese Patent Application No. 2017-510660; 5 pages.
(Continued)

*Primary Examiner* — Reema Patel
(74) *Attorney, Agent, or Firm* — Schwabe, Williamson & Wyatt, P.C.

(57) ABSTRACT

Embodiments of the present disclosure are directed towards an integrated circuit (IC) die. In embodiments, the IC die may include a semiconductor substrate, a plurality of active components disposed on a first side of the semiconductor substrate, and a plurality of passive components disposed on a second side of the semiconductor substrate. In embodiments the second side may be disposed opposite the first side. The passive components may, in some embodiments, include capacitors and/or resistors while the active components may, in some embodiments, include transistors. Other embodiments may be described and/or claimed.

11 Claims, 12 Drawing Sheets

(51) Int. Cl.
    *H01L 23/48*   (2006.01)
    *H01L 23/522*  (2006.01)
    *H01L 23/532*  (2006.01)
    *H01L 49/02*   (2006.01)
    *H01L 23/14*   (2006.01)
    *H01L 23/525*  (2006.01)

(52) U.S. Cl.
    CPC ...... *H01L 23/5226* (2013.01); *H01L 23/5228* (2013.01); *H01L 23/53238* (2013.01); *H01L 23/53252* (2013.01); *H01L 25/50* (2013.01); *H01L 28/40* (2013.01); *H01L 23/145* (2013.01); *H01L 23/525* (2013.01); *H01L 2224/16145* (2013.01); *H01L 2224/16227* (2013.01); *H01L 2924/15311* (2013.01)

(56) References Cited

U.S. PATENT DOCUMENTS

| | | |
|---|---|---|
| 2005/0195891 A1 | 9/2005 | Ogino et al. |
| 2007/0008705 A1 | 1/2007 | Hashimoto |
| 2011/0073994 A1 | 3/2011 | Liu et al. |
| 2013/0256834 A1 | 10/2013 | Tan et al. |
| 2013/0285257 A1 | 10/2013 | Lee et al. |
| 2013/0307119 A1 | 11/2013 | Chen et al. |
| 2014/0049293 A1 | 2/2014 | Mallikarjunaswamy |
| 2014/0084391 A1 | 5/2014 | Lenive |
| 2014/0225224 A1 | 8/2014 | Zhu et al. |

FOREIGN PATENT DOCUMENTS

| | | |
|---|---|---|
| EP | 3198637 B1 | 6/2019 |
| JP | 2003086731 A | 3/2003 |
| JP | 2003-282788 A | 10/2003 |
| JP | 2004327910 A | 11/2004 |
| JP | 2007019149 A | 1/2007 |
| JP | 2009200233 A | 9/2009 |
| JP | 2010-519747 A | 6/2010 |
| JP | 2010519747 A | 6/2010 |
| JP | 2014-165358 A | 9/2014 |

OTHER PUBLICATIONS

Office Action dated May 14, 2019 for Japanese Patent Application No. 2017-510660; 10 pages.
International Search Report and Written Opinion dated Jun. 26, 2015, issued in corresponding International Application No. PCT/US2014/057807, 13 pages.
Extended European Search Report dated Apr. 3, 2018 for European Patent Application No. 14902796.3, 6 pages.
Office Action dated Sep. 11, 2018 for Japanese Patent Application No. 2017-510660, 5 pages.
Office Action dated Dec. 15, 2017 for U.S. Appl. No. 15/503,377, 14 pages.
Final Office Action dated Aug. 9, 2018 for U.S. Appl. No. 15/503,377, 16 pages.
Malaysian Patent Office—Office Action dated May 28, 2020 from Malaysian Patent Application No. PI 2017700635, 3 pages

* cited by examiner

INTEGRATED CIRCUIT DIE HAVING BACKSIDE PASSIVE COMPONENTS AND METHODS ASSOCIATED THEREWITH

CROSS-REFERENCE TO RELATED APPLICATION

The present application is a continuation of U.S. application Ser. No. 15/503,377, filed Feb. 10, 2017, entitled "INTEGRATED CIRCUIT DIE HAVING BACKSIDE PASSIVE COMPONENTS AND METHODS ASSOCIATED THEREWITH", which is a national phase entry under 35 U.S.C. § 371 of International Application No. PCT/US2014/057807, filed Sep. 26, 2014, entitled "INTEGRATED CIRCUIT DIE HAVING BACKSIDE PASSIVE COMPONENTS AND METHODS ASSOCIATED THEREWITH," which designates the United States of America, the entire disclosures of which are hereby incorporated by reference in its entirety and all purposes.

FIELD

Embodiments of the present disclosure generally relate to the field of integrated circuits, and more particularly, to apparatuses and methods associated with an integrated circuit die having backside passive components.

BACKGROUND

Input/output density of integrated circuit (IC) dies is continually increasing, while IC die sizes are continually decreasing. One of the concerns in IC die design is effective usage of IC die area; however, under the current state of the art, both passive and active components are disposed on a single side of a semiconductor substrate of the IC die due to signal breakout issues of placing components on different sides of the semiconductor substrate.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings. Unless clearly indicated otherwise, these drawings are not to scale.

DETAILED DESCRIPTION

Figure 1:
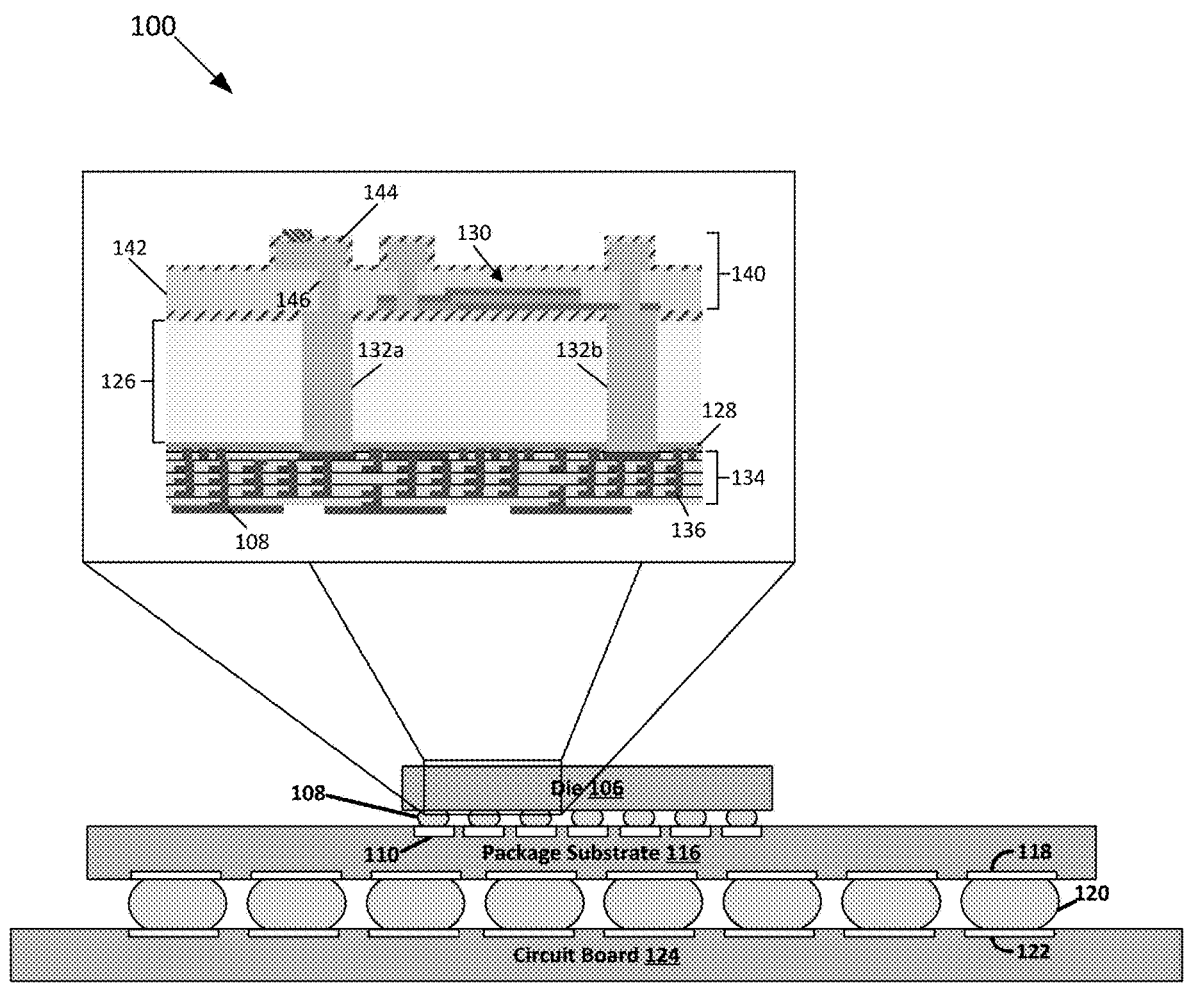
FIG. 1 schematically illustrates a cross-section side view of an example integrated circuit (IC) assembly including an IC die having backside passive components disposed thereon, in accordance with various embodiments of the present disclosure.

Embodiments of the present disclosure describe integrated circuit (IC) die configurations having backside passive components. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100. In embodiments, the IC assembly 100 may include one or more dies (e.g., die 106) electrically and/or physically coupled with a package substrate 116, as can be seen. The package substrate 116 may further be electrically coupled with a circuit board 124, as can be seen.

In embodiments, die 106 may include a semiconductor substrate 126. Semiconductor substrate 126 may comprise any suitable material (e.g., silicon). Die 106 may also include a plurality of active components disposed on a first side of the substrate, hereinafter referred to as an active side of the substrate due to the location of the active components. Such active components are depicted here by active component layer 128 representing a plurality of active components. Active components may include any component capable of controlling an electrical signal (e.g., transistors). In embodiments, die 106 may also include a plurality of passive components (e.g., metal-insulator-metal (MIM) capacitor 130) disposed on a second side of semiconductor substrate 126, hereinafter referred to as the backside of semiconductor substrate 126. As depicted, the backside of semiconductor substrate 126 may be disposed opposite the active side of semiconductor substrate 126, such that the plurality of active components may be disposed on a side opposite the plurality of passive components. Such a configuration may enable utilization of space that may have previously been unused on semiconductor substrate 126. As a result, such a configuration may enable higher input/output densities for a similarly configured IC die.

In some embodiments, die 106 may include a plurality of through-substrate vias (TSVs) (e.g., TSVs 132a and 132b, hereinafter collectively referred to as TSVs 132) disposed in the semiconductor substrate. The TSVs may be configured to route electrical signals between the active side of semiconductor substrate 126 and the backside of semiconductor substrate 126. As a result, TSVs 132 may enable one or more of the plurality of passive components to be electrically coupled with the active side of semiconductor substrate 126. In embodiments, one or more layers of electrically insulative material (e.g., layers 134) may be disposed on the active side of the semiconductor substrate. The one or more layers of electrically insulative material may, as depicted, encapsulate the plurality of active components. In embodiments, the one or more layers of electrically insulative material may include electrical routing features (e.g., electrical routing feature 136) disposed therein. In addition, a plurality of die interconnect structures (e.g., die interconnect structure 108) may be disposed in the one or more layers of the electrically insulative material. In embodiments, the electrical routing features may be configured to electrically couple the die interconnect structures with the plurality of active components and/or the plurality of TSVs. As discussed further below, the die interconnect structures may be configured to electrically couple die 106 with package substrate 116.

In embodiments, one or more redistribution layers (RDLs) (e.g., RDL 140) may be disposed on the backside of semiconductor substrate 126. The one or more RDLs may include one or more layers of electrically insulative material (e.g., layer 142) disposed on the backside of the semiconductor substrate. As depicted, the one or more layers of electrically insulative material disposed on the backside of semiconductor substrate 126 may encapsulate the plurality of passive components. The one or more RDLs may also include a plurality of interconnect structures (e.g., landing pad 144) disposed in the one or more layers of the electrically insulative material. The one or more RDLs may also include electrical routing features (e.g., via 146) disposed in the one or more second layers of electrically insulative material. In embodiments, the electrical routing features may be configured to electrically couple the plurality of interconnect structures with the plurality of passive components.

Die 106 may be attached to package substrate 116 according to a variety of suitable configurations, including a flip-chip configuration, as depicted, or other configurations such as, for example, being embedded in the package substrate 116 or being configured in a wirebonding arrangement. In the flip-chip configuration, the die 106 may be attached to a surface of the package substrate 116 via die interconnect structures 108 such as bumps, pillars, or other suitable structures that may also electrically couple die 106 with the package substrate 116.

Die 106 may represent a discrete chip made from a semiconductor material and may be, include, or be a part of a processor, memory, or ASIC in some embodiments. In some embodiments, an electrically insulative material such as, for example, molding compound or underfill material (not pictured) may partially encapsulate a portion of die 106 and/or interconnect structures 108. Die interconnect structures 108 may be configured to route the electrical signals between die 106 and package substrate 116.

Package substrate 116 may include electrical routing features configured to route electrical signals to or from die 106. The electrical routing features may include, for example, traces disposed on one or more surfaces of package substrate 116 and/or internal routing features such as, for example, trenches, vias, or other interconnect structures to route electrical signals through package substrate 116. For example, in some embodiments, package substrate 116 may include electrical routing features (such as die bond pads 110) configured to receive the die interconnect structures 108 and route electrical signals between die 106 and package substrate 116. In some embodiments, the package substrate 116 is an epoxy-based laminate substrate having a core and/or build-up layers such as, for example, an Ajinomoto Build-up Film (ABF) substrate.

The circuit board 124 may be a printed circuit board (PCB) composed of an electrically insulative material such as an epoxy laminate. For example, the circuit board 116 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias, may be formed through the electrically insulating layers to route the electrical signals of the die 106 through the circuit board 124. The circuit board 124 may be composed of other suitable materials in other embodiments. In some embodiments, the circuit board 124 is a motherboard (e.g., motherboard 1202 of FIG. 12).

Package-level interconnects such as, for example, solder balls 120 or land-grid array (LGA) structures may be coupled to one or more lands (hereinafter "lands 118") on the package substrate 116 and one or more pads 122 on the circuit board 124 to form corresponding solder joints that are configured to further route the electrical signals between the package substrate 116 and the circuit board 124. Other suitable techniques to physically and/or electrically couple the package substrate 116 with the circuit board 124 may be used in other embodiments.

Figure 2:
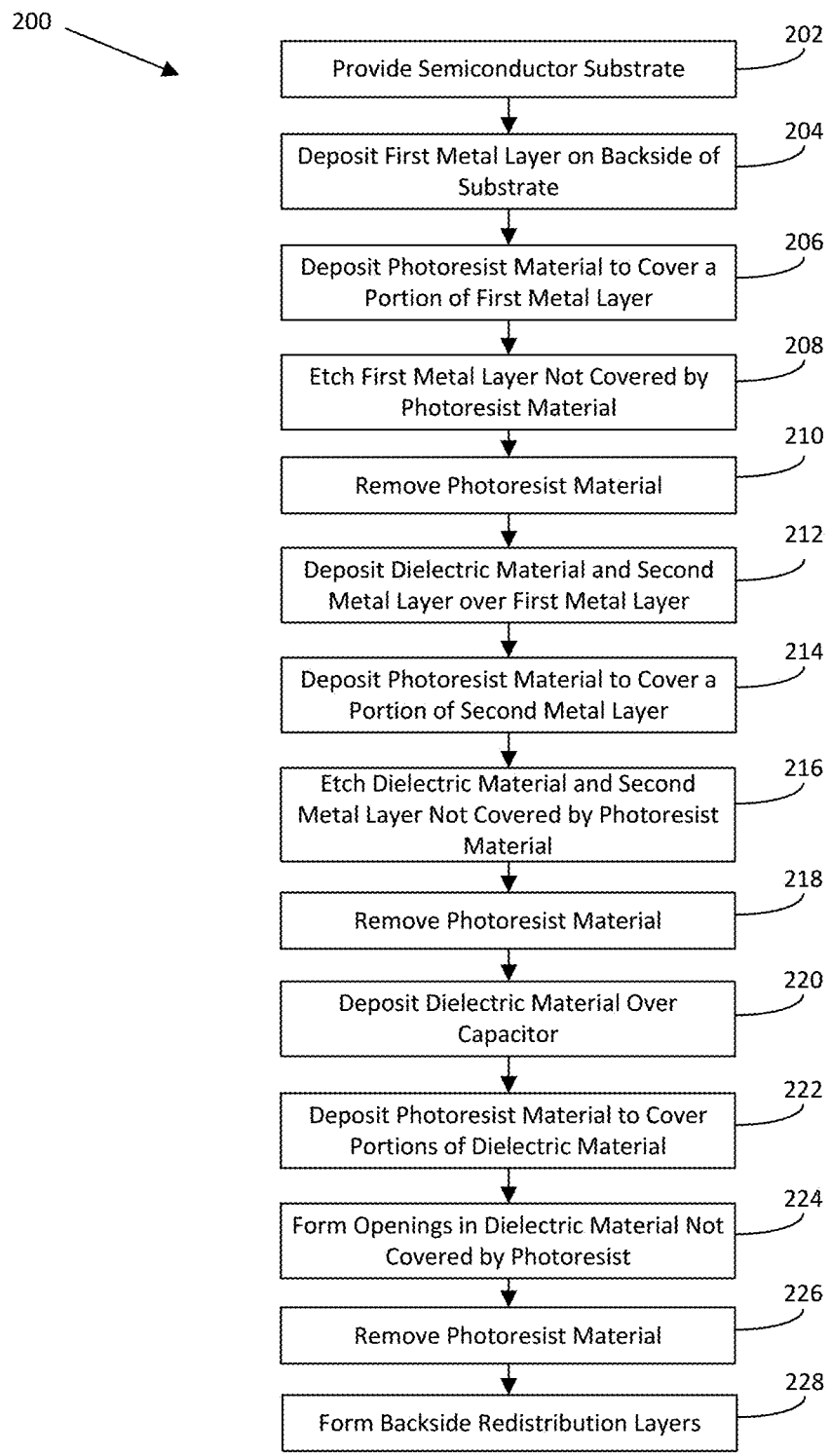
FIG. 2 is an illustrative flow diagram of an integrated circuit (IC) die fabrication process in accordance with various embodiments of the present disclosure.
Figure 3:
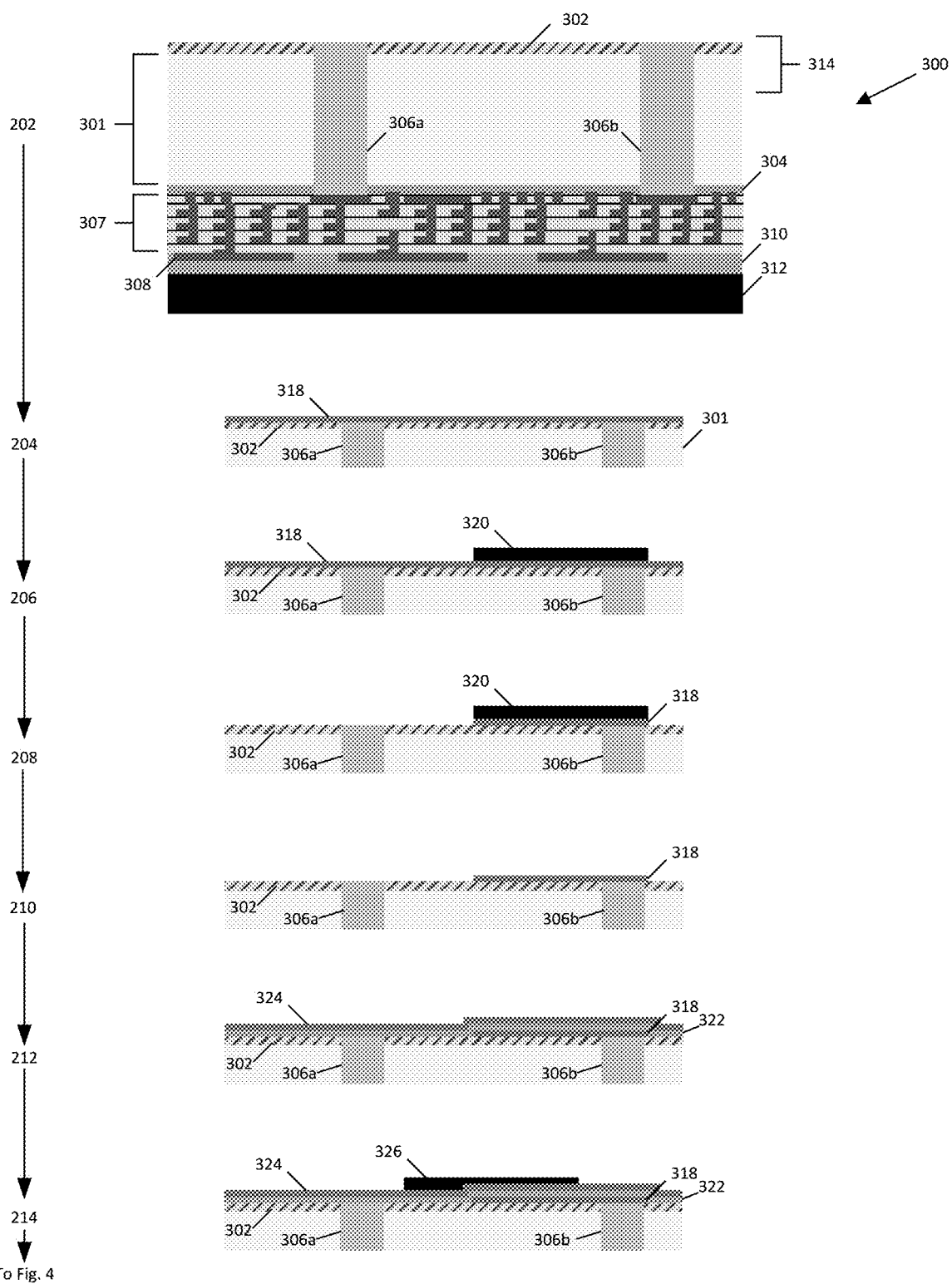
FIGS. 3-4 are illustrative cross-section views of selected operations illustrating stages in the IC die fabrication process of FIG. 2, in accordance with various embodiments of the present disclosure.
Figure 4:
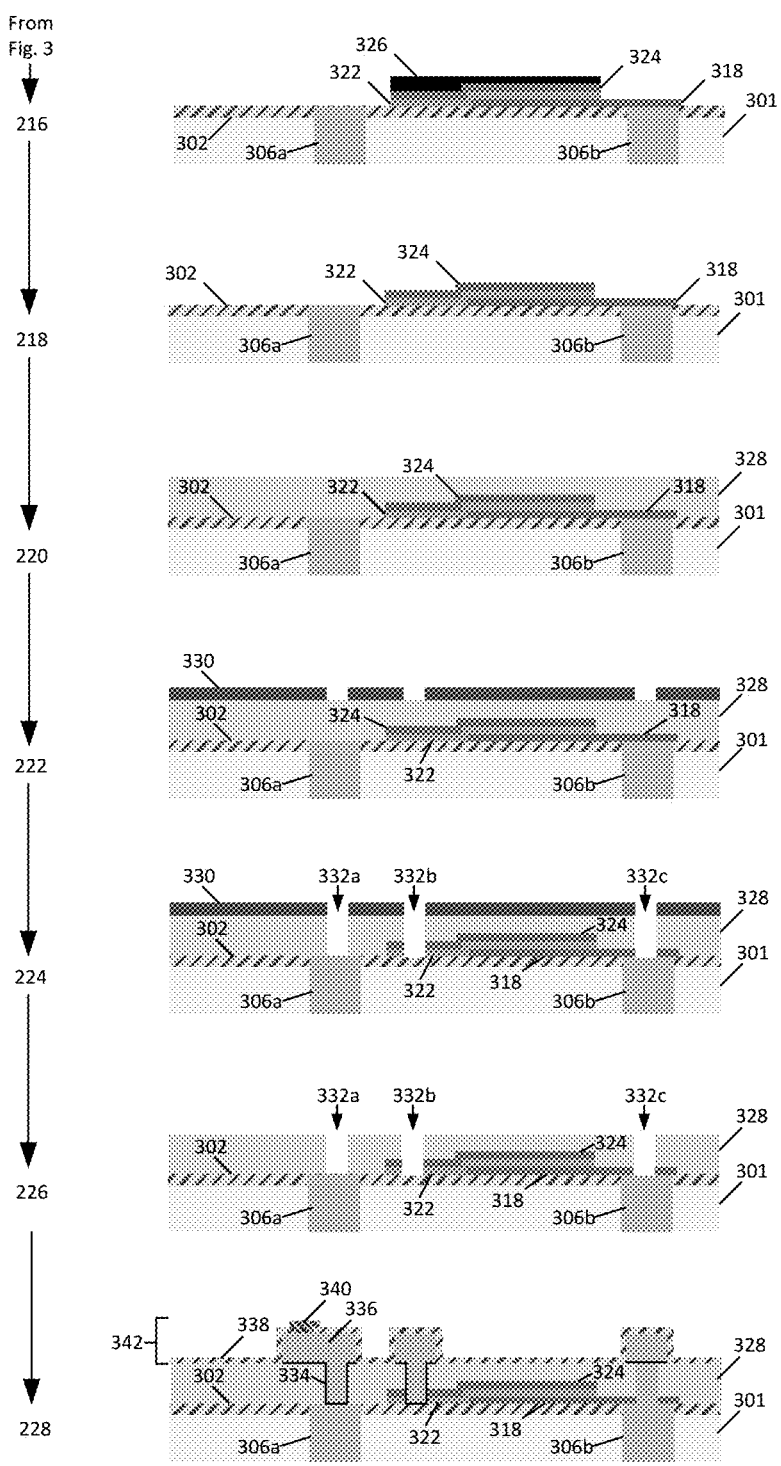

FIG. 2 is an illustrative flow diagram of an integrated circuit (IC) die fabrication process for forming backside metal-insulator-metal (MIM) capacitors in accordance with some embodiments of the present disclosure. FIGS. 3-4 provide cross-section views of selected operations illustrating stages in the IC die fabrication process 200, in accordance with various embodiments. As a result, FIGS. 2-4 will be described in conjunction with one another. To aid in this description, the operations performed in FIG. 2 are referenced on the arrows moving from operation to operation in FIGS. 3-4. Furthermore, to enable more detailed views of the IC die fabrication, only a portion of an IC die is depicted in each procedure. In addition, not all reference numbers may be depicted in each operation in FIGS. 3-4.

The process may begin at block 202, where a semiconductor substrate 301 may be provided. In some embodiments, as depicted, the semiconductor substrate may be provided in the form of an IC die assembly (e.g., IC die assembly 300). IC die assembly may have an electrically insulative layer 302, such as a passivation layer, disposed on a backside of semiconductor substrate 301. Electrically insulative layer 302 may comprise any suitable material, including silicon nitride (SiN) or silicon carbide (SiC), for example. IC die assembly 300 may also include a plurality of active components (e.g., those depicted by layer 304) disposed on an active side of semiconductor substrate 301. In some embodiments, IC die assembly 300 may include a plurality of through-substrate vias (TSVs) (e.g., TSVs 306a and 306b, hereinafter collectively referred to as TSVs 306) disposed in semiconductor substrate 301. The TSVs may be configured to route electrical signals between the active side of semiconductor substrate 301 and the backside of semiconductor substrate 301. In embodiments, one or more layers of electrically insulative material (e.g., layers 307) may be disposed on the active side of the semiconductor substrate 301. The one or more layers of electrically insulative material may, as depicted, encapsulate the plurality of active components. In embodiments, the one or more layers of electrically insulative material may include electrical routing features disposed therein. In addition, a plurality of die interconnect structures (e.g., die interconnect structure 308) may be disposed in the one or more layers of the electrically insulative material. In embodiments, the electrical routing features may be configured to electrically couple the die interconnect structures with the plurality of active components and/or the plurality of TSVs. In some embodiments, IC die assembly 300 may be provided with a carrier wafer 312 attached by way of an adhesive 310 (e.g., glue). In other embodiments, semiconductor substrate 301 may be provided with fewer or without any of the above described aspects of IC die assembly 300 and the above described portions of IC die assembly 300 may be formed on semiconductor substrate 301 in conjunction with the procedures depicted by the remainder of FIGS. 2-4. To facilitate the description of each process, the remaining procedures will only depict the backside portion of IC die assembly 300 represented here by the area of IC die assembly encompassed by section 314.

Once semiconductor substrate 301 has been provided, the process may proceed to block 204, where fabrication of an MIM capacitor may begin through deposition of first metal layer 318 on the backside of semiconductor substrate 301. First metal layer 318 may be referred to as a capacitor bottom electrode and may comprise tantalum, tantalum nitride, titanium, titanium nitride, or any other suitable materials. In embodiments, as depicted, the first metal layer may be formed over one or more of the TSVs (e.g., TSV 306b) disposed in semiconductor substrate 301. In other embodiments, such as that depicted in FIG. 10, semiconductor substrate 301 may not be formed over any TSVs. Such embodiments are discussed in greater detail in reference to FIG. 10, below.

At block 206, a photoresist layer 320 may be formed from photoresist material on one or more portions of first metal layer 318. Such a layer may be formed by applying the photoresist material, patterning the photoresist material by exposing the photoresist material to an ultraviolet light source or a laser, and developing the photoresist material that was not exposed to the ultraviolet light source or the laser through application of an appropriate solvent. While only a single portion of photoresist material is depicted, it will be appreciated that photoresist layer 320 may include any number of portions of photoresist material at locations on the first metal layer where the first metal layer is to be preserved (e.g., any location where a capacitor bottom electrode is desired).

At block 208, the portion of first metal layer 318 that is not covered by photoresist layer 320 may be removed. This may be accomplished through any suitable dry or wet etch process. At block 210, photoresist layer 320 may be removed and any remaining residues may be cleaned off the surface of first metal layer 318.

At block 212, a dielectric layer 322 may be formed on a surface of first metal layer 318 and a second metal layer 324 may be formed on a surface of dielectric layer 322. Dielectric layer 322 may be referred to as a capacitor dielectric and as such may be composed of any suitable capacitor dielectric material, including, but not limited to, aluminum oxide ($Al_2O_3$), aluminum nitride (AlN), silicon dioxide ($SiO_2$), silicon nitride ($Si_3N_4$), tantalum oxide ($Ta_2O_5$), titanium oxide ($TiO_2$), or hafnium oxide ($HfO_2$), or any combinations thereof. Second metal layer 324 may be referred to as a capacitor top electrode and may comprise any suitable material, including, but not limited to, tantalum, tantalum nitride, titanium, titanium nitride, or any other suitable materials. It will be appreciated that the thickness of dielectric layer 322 and/or second metal layer 324 may be adjusted to achieve any desired electrical characteristics of the resulting MIM capacitor.

At block 214, another photoresist layer 326 may be formed from photoresist material on one or more portions of second metal layer 324. This may be accomplished in a similar manner to that described above in reference to block 206. While only a single portion of photoresist material is depicted, it will be appreciated that photoresist layer 326 may include any number of portions of photoresist material at locations on the second metal layer 324 where the second metal layer 324 and the underlying dielectric layer 322 are to be preserved (e.g., any location where a capacitor top electrode is desired).

At block 216, the portion of second metal layer 324 and dielectric layer 322 not covered by photoresist layer 326 may be removed. This may be accomplished through any suitable dry or wet etch process. At block 218, photoresist layer 326 may be removed to reveal second metal layer 324. First metal layer 318, dielectric layer 322, and second metal layer 324 may combine to form the MIM capacitor.

At block 220, an electrically insulative layer 328 may be deposited over the MIM capacitor. Electrically insulative layer 328 may comprise any suitable material, including, but not limited to, silicon nitride (SiN) or silicon carbide (SiC). Electrically insulative material may, in some embodiments, form a hermetic barrier that may protect first metal layer 318 and second metal layer 324 from oxidation and from trace metal and moisture contamination. Such a layer may also be referred to as a passivation layer.

At block 222, yet another photoresist layer 330 may be formed over electrically insulative layer 328. As depicted a number of openings may also be formed in photoresist layer 330 to expose corresponding locations of electrically insulative layer 328 to be removed. Photoresist layer 330 may be formed in a similar manner to that described in reference to block 206, above. The openings in the photoresist layer may be formed at locations where electrical connections between the first metal layer 318, the second metal layer 324, or one or more of the TSVs may be desired.

At block 224, via holes 332a-c may be formed in electrically insulative layer 328. Via holes 332a-c may be formed through any suitable process, such as, for example, a plasma etch process using the patterned photoresist material. At block 226, photoresist layer 330 may be removed and any remaining residues may be cleaned off the surface of electrically insulative layer 328.

At block 228 redistribution layer (RDL) 342 may be formed. In an embodiment, RDL 342 may be formed by first disposing an RDL barrier (e.g., RDL barrier 334) and a copper seed layer onto the backside surface and into via holes 332a-c. A photoresist material may then be applied and openings formed in the photoresist over the via holes 332a-c and at those locations where backside electrical routing features 336 are desired. Backside electrical routing features 336 may include wire traces for distributing electrical signals from one location to another, and landing pads for creating electrical connections to another die (described in reference to FIGS. 10-11 below). The backside electrical routing features 336 may provide for signal breakout of the passive components (e.g., the MIM capacitor formed above) or signal breakout to one of the TSVs (e.g., TSV 306a) disposed in semiconductor substrate 301. Next, a metallic material such as copper or gold may be disposed inside the resist openings using an electroplating technique, filling via holes 332a-c to metalize the vias and forming backside electrical routing features 336 simultaneously. The photoresist material may then be removed, and the copper seed layer and RDL barrier material in between the backside electrical routing features 336 may be removed using wet or dry etch processes. The backside electrical routing features 336 may have a passivation layer 338 formed thereon. The passivation layer may protect the landing pads from oxidation and from trace metal and moisture contamination. In embodiments, passivation layer 338 may have openings at the locations of the landing pads that may have a surface finish 340 formed therein. In embodiments, the surface finish may be a solder compatible surface finish. Suitable surface finishes include, but are not limited to: electroless cobalt phosphide (CoP)/immersion gold (Au); electroless cobalt tungsten phosphide (CoWP)/immersion Au; electroless nickel phosphide (NiP)/immersion Au; electroless NiP/electroless palladium (Pd)/immersion Au; electroless tin (Sn); electroless NiP/electroless Sn; electroless CoWP/electroless Sn; electroless copper (Cu)/electroless CoP/immersion Au; electroless Cu/electroless CoWP/immersion Au; electroless Cu/electroless; NiP/immersion Au; electroless Cu/electroless NiP/electroless Pd/immersion Au; electroless Cu/electroless Sn; electroless Cu/electroless NiP/electroless Sn; electroless Cu/electroless CoP/immersion Au; electroless Cu/electroless CoWP/electroless Sn. It will be appreciated that other surface finishes may also be suitable depending on chip-to-chip solder material(s) and/or chip-to-chip attachment methods that may be employed. In some embodiments, a die interconnect structure (e.g., bump) may be formed on top of, in addition to, or instead of the surface finish on top of one or more of the landing pads. The die interconnect structure (e.g., bump) may be formed from, for example, lead-tin (PbSn), Sn, tin-silver (SnAg), copper (Cu), indium (In), SnAgCu, SnCu, Au, etc. After block 228, the IC die may be detached from the temporary carrier wafer using any suitable, available wafer de-bonding equipment and processing. In other embodiments, the RDL 342 may include backside electrical routing features 336 consisting of a metallic material such as aluminum which are formed using a conventional subtractive etch-type process sequence.

Figure 5:
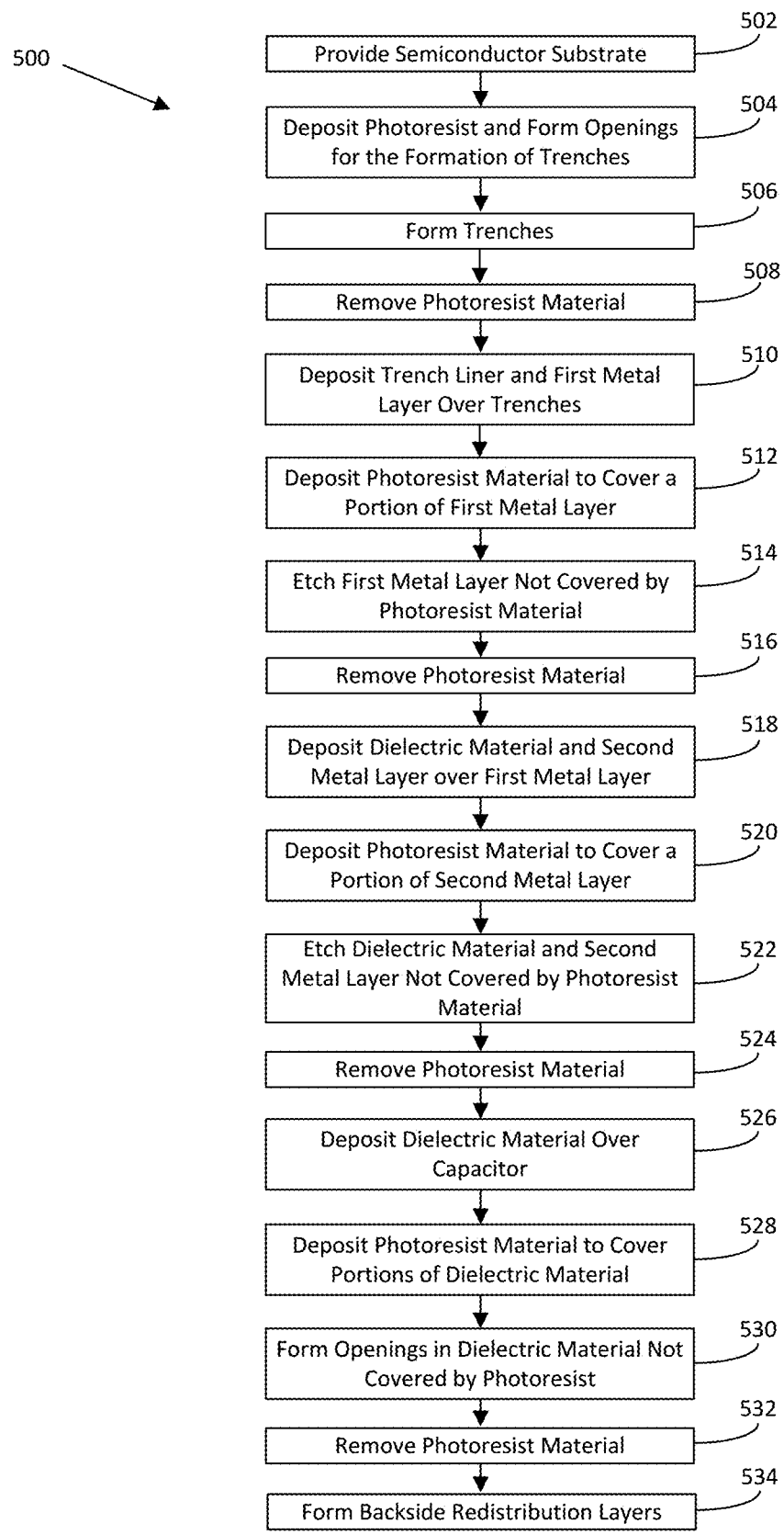
FIG. 5 is an illustrative flow diagram of an integrated circuit (IC) die fabrication process in accordance with various embodiments of the present disclosure.
Figure 6:
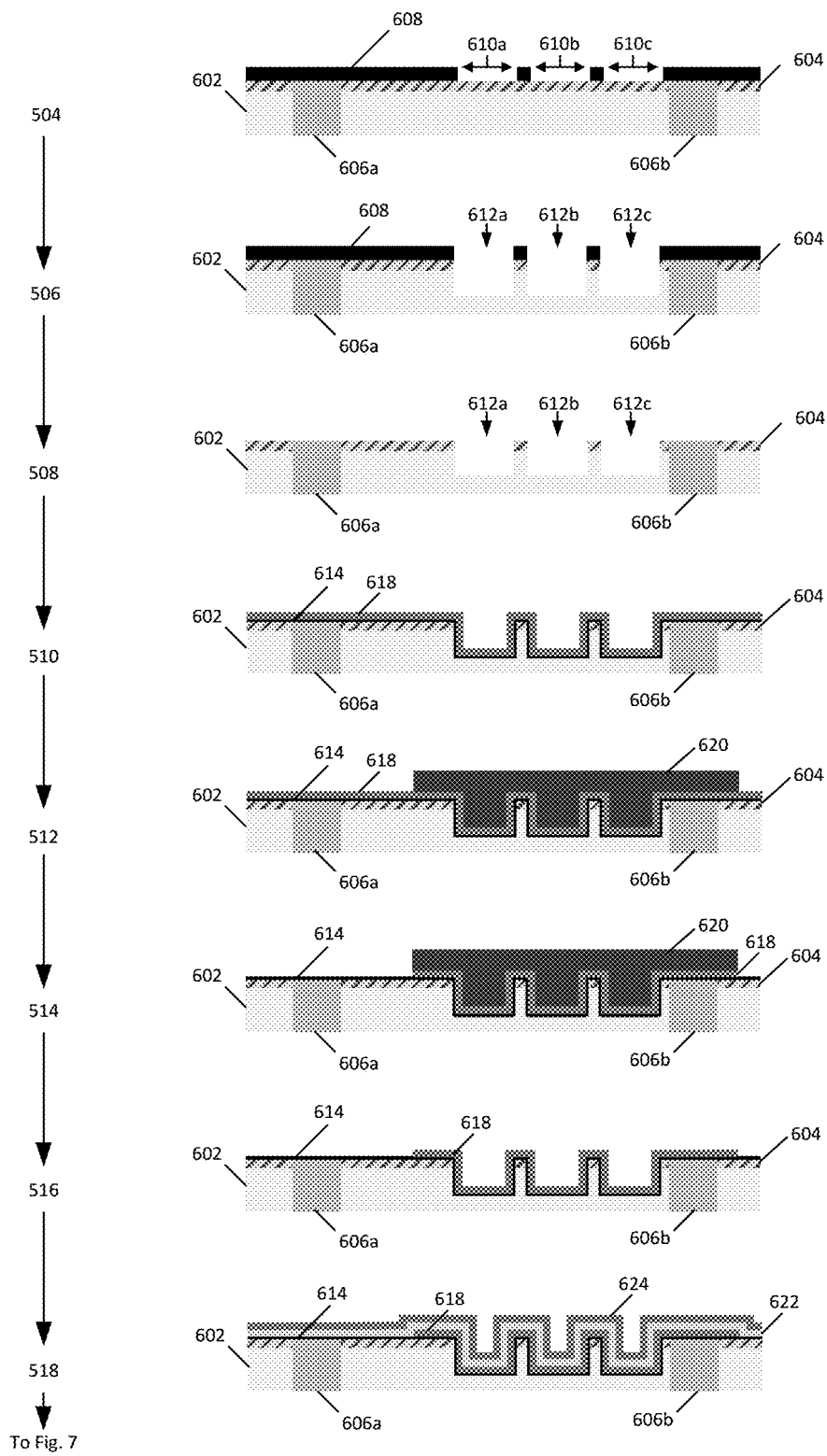
FIGS. 6-7 are illustrative cross-section views of selected operations illustrating stages in the IC die fabrication process of FIG. 5, in accordance with various embodiments of the present disclosure.
Figure 7:
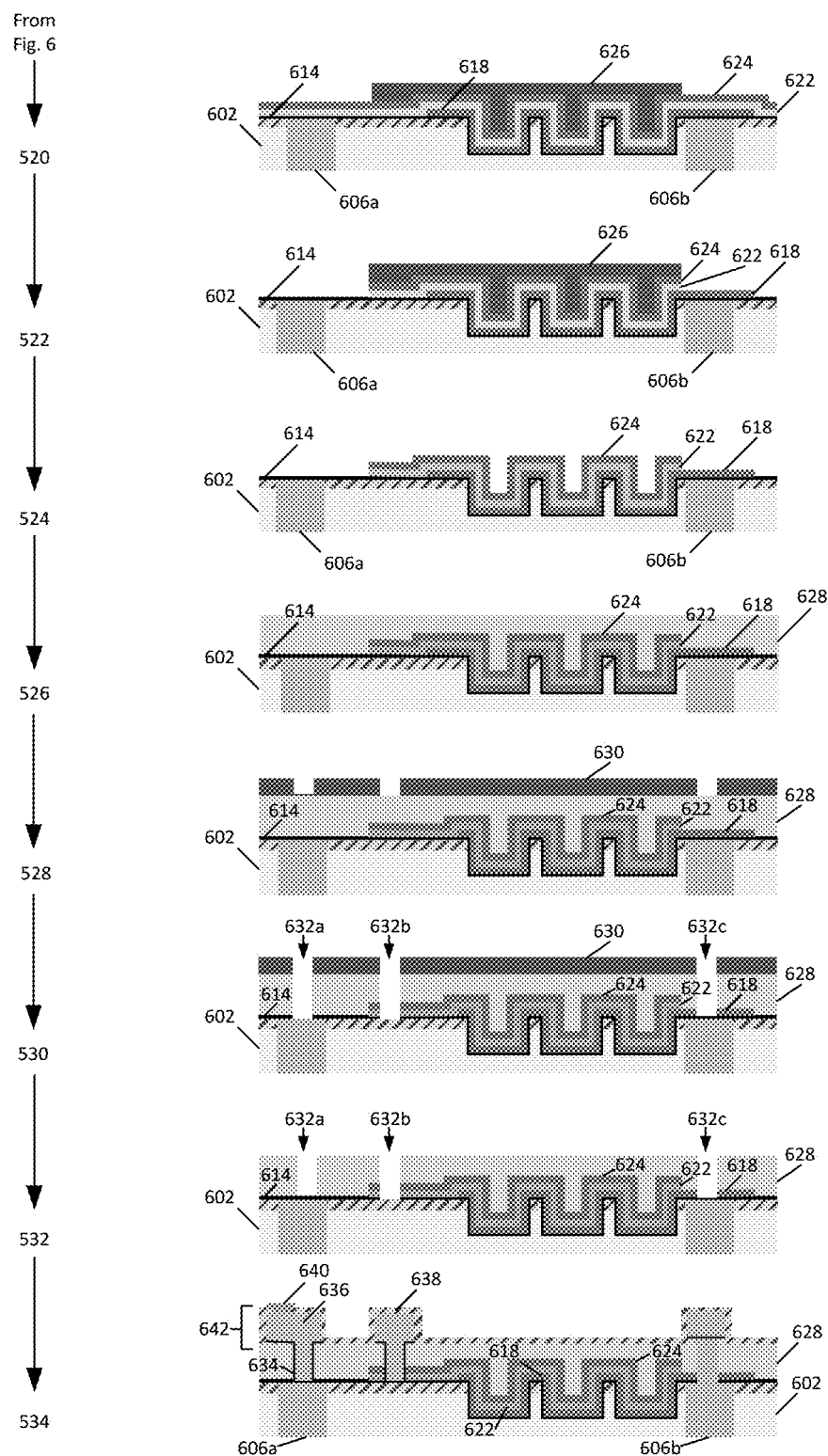

FIG. 5 is an illustrative flow diagram of an integrated circuit (IC) die fabrication process in accordance with some embodiments of the present disclosure. FIGS. 6-7 provide cross-section views of selected operations illustrating stages in the IC die fabrication process 500, in accordance with an illustrative embodiment. As a result, FIGS. 5-7 will be described in conjunction with one another. To aid in this description, the operations performed in FIG. 5 are referenced on the arrows moving from operation to operation in FIGS. 6-7. Furthermore, to enable more detailed views of the IC die fabrication, only a portion of an IC die is depicted in each procedure. In addition, not all reference numbers may be depicted in each operation in FIGS. 6-7.

The process may begin at block 502, where a semiconductor substrate 602 may be provided. In some embodiments, the semiconductor substrate may be provided in the form of an IC die assembly (e.g., IC die assembly 300 of FIG. 3 discussed at length above). The process may then proceed to block 504 where a photoresist layer 608 may be formed on electrically insulative layer 604. Such a layer may be formed by applying photoresist material, patterning the photoresist material by exposing the photoresist material to an ultraviolet light source or a laser, and developing the photoresist material that was not exposed to the ultraviolet light source or the laser through application of an appropriate solvent. This patterning may result in the photoresist layer 608 having openings 610a-610c formed therein at locations where trenches are to be formed in semiconductor substrate 602.

At block 506, trenches 612a-c may be formed in semiconductor substrate 602. These trenches may be formed through an etching process, such as a plasma etch process. It will be appreciated that, while the cross-section of the trenches may be rectangular, when viewed from the top down, the trenches may be in the shape of a square, rectangle, circle, oval, etc. At block 508, the photoresist material may be removed, along with any residue that may have remained on the surface of electrically insulative layer 604.

At block 510, a trench liner 614 may be formed. Trench liner 614 may be, or include, any suitable electrically insulative material (e.g., silicon dioxide ($SiO_2$)). In addition, a first metal layer 618 may be deposited on the backside of semiconductor substrate 602. First metal layer 618 may be referred to as a capacitor bottom electrode and may comprise tantalum, tantalum nitride, titanium, titanium nitride, or any other suitable materials. In embodiments, as depicted, the first metal layer 618 may be formed over one or more of the TSVs (e.g. TSV 606b) disposed in semiconductor substrate 602. In other embodiments, such as that depicted in FIG. 10, first metal layer 618 may not be formed over any TSVs. Such embodiments are discussed in greater detail in reference to FIG. 10, below.

At block 512, a photoresist layer 620 may be formed, as discussed above in reference to block 504, on one or more portions of first metal layer 618. At block 514, the portion of first metal layer 618 that is not covered by photoresist layer 620 may be removed. This may be accomplished through any suitable dry or wet etch process. At block 516, photoresist layer 620 may be removed and any remaining residues may be cleaned off the surface of first metal layer 618.

At block 518, a dielectric layer 622 may be formed on a surface of first metal layer 618 and a second metal layer 624 may be formed on a surface of dielectric layer 622. Dielectric layer 622 may be referred to as a capacitor dielectric and as such may be composed of any suitable capacitor dielectric material, including, but not limited to aluminum oxide ($Al_2O_3$), aluminum nitride (AlN), silicon dioxide ($SiO_2$), silicon nitride ($Si_3N_4$), tantalum oxide ($Ta_2O_5$), titanium oxide ($TiO_2$), or hafnium oxide ($HfO_2$), or any combinations thereof. Second metal layer 624 may be referred to as a capacitor top electrode and may comprise any suitable material, including, but not limited to, tantalum, tantalum nitride, titanium, titanium nitride, or any other suitable materials. It will be appreciated that the thickness of dielectric layer 622 and/or second metal layer 624 may be adjusted to achieve any desired electrical characteristics of the resulting trench capacitor.

At block 520, another photoresist layer 626 may be formed from photoresist material on one or more portions of second metal layer 624. This may be accomplished in a similar manner to that described above in reference to block 504. While only a single portion of photoresist material is depicted, it will be appreciated that photoresist layer 626 may include any number of portions of photoresist material at locations on the second metal layer 624 where the second metal layer 624 and the underlying dielectric layer 622 are to be preserved (e.g., any location where a capacitor top electrode is desired).

At block 522, the portion of second metal layer 624 and dielectric layer 622 not covered by photoresist layer 626 may be removed. This may be accomplished through any suitable dry or wet etch process. At block 524, photoresist layer 626 may be removed to reveal second metal layer 624. First metal layer 618, dielectric layer 622, and second metal layer 624 may combine to form a trench capacitor.

At block 526, an electrically insulative layer 628 may be deposited over the trench capacitor. Electrically insulative layer 628 may comprise any suitable material, including, but not limited to, silicon nitride (SiN) or silicon carbide (SiC). Electrically insulative material may, in some embodiments, form a hermetic barrier that may protect first metal layer 618 and second metal layer 624 from oxidation and from trace metal and moisture contamination. Such an electrically insulative layer may be referred to as a passivation layer.

At block 528, yet another photoresist layer 630 may be formed over electrically insulative layer 628. As depicted a number of openings may also be formed in photoresist layer 630 to expose corresponding locations of electrically insulative layer 628 to be removed. Photoresist layer 630 may be formed in a similar manner to that described in reference to block 504, above. The openings in the photoresist layer may be formed at locations where electrical connections between the first metal layer 618, the second metal layer 624, and/or one or more of the TSVs may be desired.

At block 530, via holes 632a-c may be formed in electrically insulative layer 628. Via holes 632a-c may be formed through any suitable process, such as, for example, a plasma etch process using the patterned photoresist material. At block 532, photoresist layer 630 may be removed and any remaining residues may be cleaned off the surface of electrically insulative layer 628.

At block 534 redistribution layer (RDL) 642 may be formed. In an embodiment, RDL 642 may be formed by first disposing an RDL barrier (e.g., RDL barrier 634) and a copper seed layer onto the backside surface and into via holes 632a-c. A photoresist material may then be applied and openings formed in the photoresist over the via holes 632a-c and at those locations where backside electrical routing features 636 are desired. Backside electrical routing features 636 may include wire traces for distributing electrical signals from one location to another, and landing pads for creating electrical connections to another die (described in reference to FIGS. 10-11 below). The backside electrical routing features 636 may provide for signal breakout of the passive components (e.g., the trench capacitor formed above) or signal breakout to one of the TSVs (e.g., TSV 606a) disposed in semiconductor substrate 602. Next, a metallic material such as copper or gold may be disposed inside the resist openings using an electroplating technique, filling via holes 632a-c to metalize the vias and forming backside electrical routing features 636 simultaneously. The photoresist material may then be removed, and the copper seed layer and RDL barrier material in between the backside electrical routing features 636 may be removed using wet or dry etch processes. The backside electrical routing features 636 may have a passivation layer 638 formed thereon. The passivation layer may protect the landing pads from oxidation and from trace metal and moisture contamination. In embodiments, passivation layer 638 may have openings at the locations of the landing pads that may have a surface finish 640 formed therein. In embodiments, the surface finish may be a solder compatible surface finish. Suitable surface finishes include, but are not limited to: electroless cobalt phosphide (CoP)/immersion gold (Au); electroless cobalt tungsten phosphide (CoWP)/immersion Au; electroless nickel phosphide (NiP)/immersion Au; electroless NiP/ electroless palladium (Pd)/immersion Au; electroless tin (Sn); electroless NiP/electroless Sn; electroless CoWP/electroless Sn; electroless copper (Cu)/electroless CoP/immersion Au; electroless Cu/electroless CoWP/immersion Au; electroless Cu/electroless; NiP/immersion Au; electroless Cu/electroless NiP/electroless Pd/immersion Au; electroless Cu/electroless NiP; electroless Cu/electroless NiP/electroless Sn; electroless Cu/electroless CoP/immersion Au; electroless Cu/electroless CoWP/electroless Sn. It will be appreciated that other surface finishes may also be suitable depending on chip-to-chip solder material(s) and/or chip-to-chip attachment methods that may be employed. In some embodiments, a die interconnect structure (e.g., bump) may be formed on top of, in addition to, or instead of the surface finish on top of one or more of the landing pads. The die interconnect structure (e.g., bump) may be formed from, for example, lead-tin (PbSn), Sn, tin-silver (SnAg), copper (Cu), indium (In), SnAgCu, SnCu, Au, etc. After block 534, the IC die may be detached from the temporary carrier wafer using any suitable, available wafer de-bonding equipment and processing. In other embodiments, the RDL 642 may include backside electrical routing features 636 consisting of a metallic material such as aluminum which are formed using a conventional subtractive etch-type process sequence.

Figure 8:
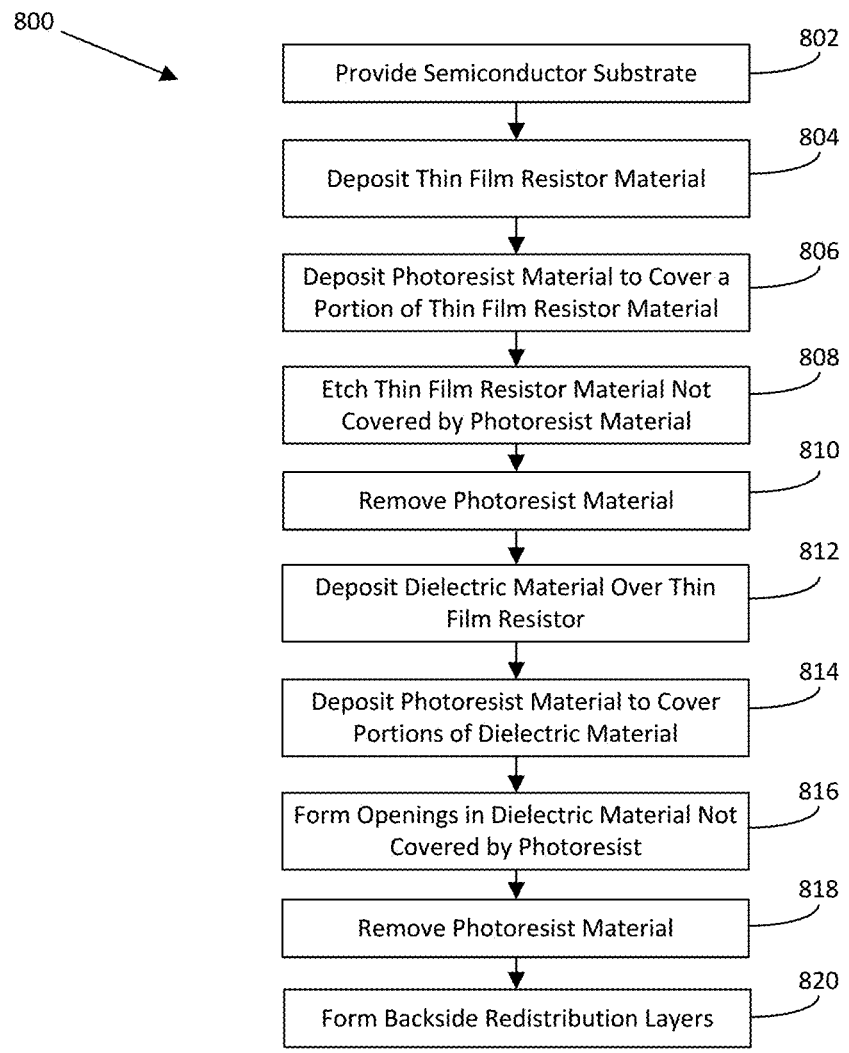
FIG. 8 is an illustrative flow diagram of an integrated circuit (IC) die fabrication process in accordance with various embodiments of the present disclosure.
Figure 9:
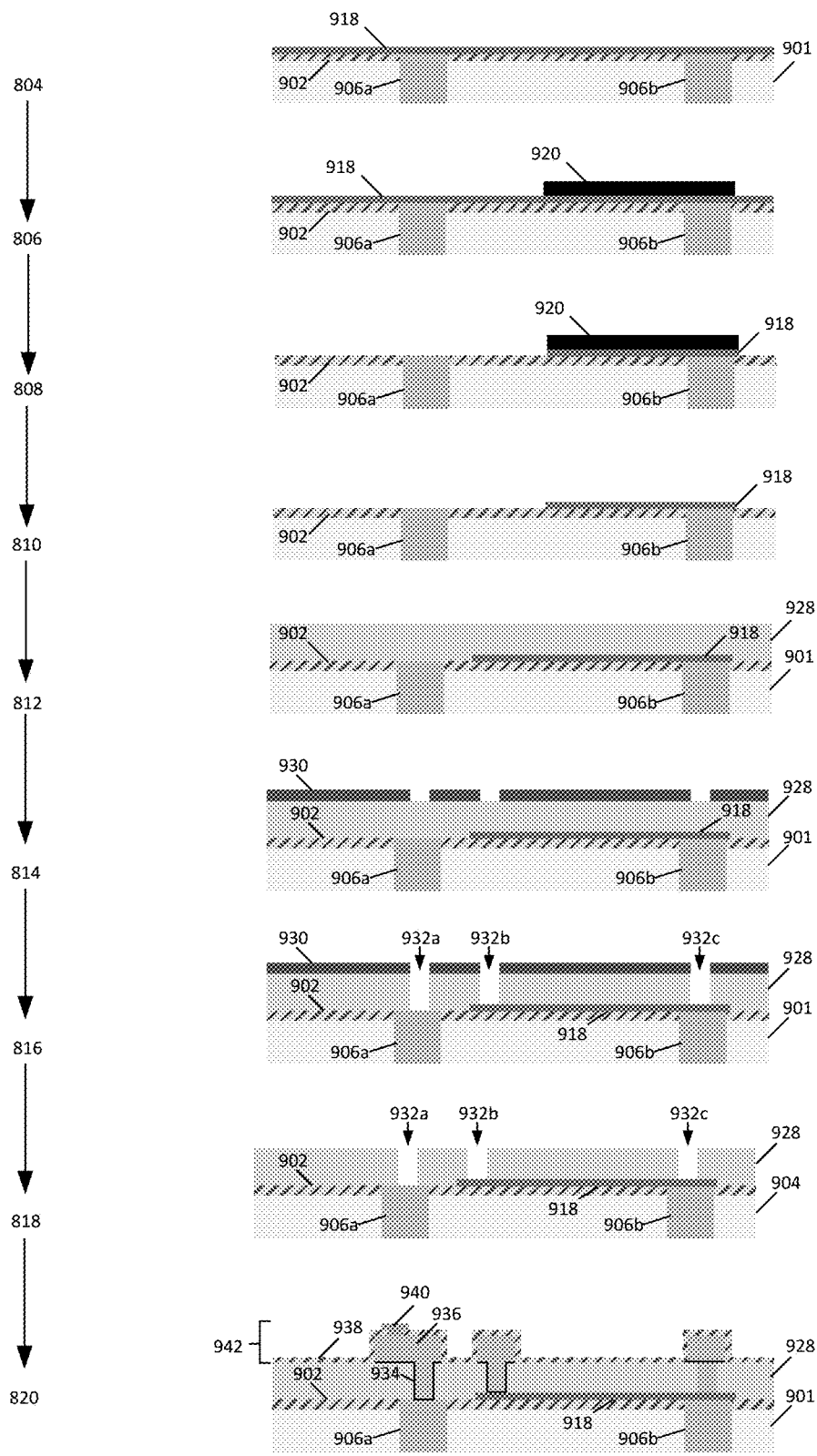
FIG. 9 is illustrative cross-section views of selected operations illustrating stages in the IC die fabrication process of FIG. 8, in accordance with various embodiments of the present disclosure.

FIG. 8 is an illustrative flow diagram of an integrated circuit (IC) die fabrication process in accordance with some embodiments of the present disclosure. FIG. 9 provides cross-section views of selected operations illustrating stages in the IC die fabrication process 800, in accordance with an illustrative embodiment. As a result, FIGS. 8 and 9 will be described in conjunction with one another. To aid in this description, the operations performed in FIG. 8 are referenced on the arrows moving from operation to operation in FIG. 9. Furthermore, to enable more detailed views of the IC die fabrication, only a portion of a die is depicted in each procedure. In addition, not all reference numbers may be depicted in each operation in FIG. 9.

The process may begin at block 802, where a semiconductor substrate 901 may be provided. In some embodiments, the semiconductor substrate may be provided in the form of an IC die assembly (e.g., IC die assembly 300 of FIG. 3 discussed at length above). The process may then proceed to block 804, where a thin film resistor layer 918 may be deposited on the backside of semiconductor substrate 901. Thin film resistor layer 918 may comprise tantalum, tantalum nitride, titanium, nickel chromium (NiCr), or any other suitable materials. In embodiments, as depicted, the thin film resistor layer 918 may be formed over one or more of the TSVs (e.g. TSV 906b) disposed in semiconductor substrate 901. In other embodiments, such as that depicted in FIG. 10, the semiconductor substrate 901 may not be formed over any TSVs. Such embodiments are discussed in greater detail in reference to FIG. 10, below.

At block 806, a photoresist layer 920 may be formed from photoresist material on one or more portions of thin film resistor layer 918. Such a layer may be formed by applying the photoresist material, patterning the photoresist material by exposing the photoresist material to an ultraviolet light source or a laser, and developing the photoresist material that was not exposed to the ultraviolet light source or the laser through application of an appropriate solvent. While only a single portion of photoresist material is depicted, it will be appreciated that photoresist layer 920 may include any number of portions of photoresist material at locations on the thin film resistor layer where the thin film resistor layer is to be preserved (e.g., any location where a resistor is desired).

At block 808, the portion of thin film resistor layer 918 that is not covered by photoresist layer 920 may be removed. This may be accomplished through any suitable dry or wet etch process. At block 810, photoresist layer 920 may be removed and any remaining residues may be cleaned off the surface of thin film resistor layer 918.

At block 812, an electrically insulative layer 928 may be deposited over the thin film resistor layer 918. Electrically insulative layer 928 may comprise any suitable material, including, but not limited to, silicon nitride (SiN) or silicon carbide (SiC). Electrically insulative material may, in some embodiments, form a hermetic barrier that may protect thin film resistor layer 918 from oxidation and from trace metal and moisture contamination. Such an electrically insulative layer may be referred to as a passivation layer.

At block 814, yet another photoresist layer 930 may be formed over electrically insulative layer 928. As depicted a number of openings may also be formed in photoresist layer 930 to expose corresponding locations of electrically insulative layer 928 to be removed. Photoresist layer 930 may be formed in a similar manner to that described in reference to block 804, above. The openings in the photoresist layer 930 may be formed at locations where electrical connections between the thin film resistor layer 918 and/or one or more of the TSVs may be desired.

At block 816, via holes 932a-c may be formed in electrically insulative layer 928. Via holes 932a-c may be formed through any suitable process, such as, for example, a plasma etch process using the patterned photoresist material. At block 818, photoresist layer 930 may be removed and any remaining residues may be cleaned off the surface of electrically insulative layer 928.

At block 820. redistribution layer (RDL) 942 may be formed. In an embodiment, RDL 942 may be formed by first disposing an RDL barrier (e.g., RDL barrier 934) and a copper seed layer onto the backside surface and into via holes 932a-c. A photoresist material may then be applied and openings formed in the photoresist over the via holes 932a-c and at those locations where backside electrical routing features 936 are desired. Backside electrical routing features 936 may include wire traces for distributing electrical signals from one location to another, and landing pads for creating electrical connections to another die (described in reference to FIGS. 10-11 below). The backside electrical routing features 936 may provide for signal breakout of the passive components (e.g., the resistor formed by thin film resistor layer 918) or signal breakout to one of the TSVs (e.g., TSV 906a) disposed in semiconductor substrate 901. Next, a metallic material such as copper or gold may be disposed inside the resist openings using an electroplating technique, filling via holes 932a-c to metalize the vias and forming backside electrical routing features 936 simultaneously. The photoresist material may then be removed, and the copper seed layer and RDL barrier material in between the backside electrical routing features 936 may be removed using wet or dry etch processes. The backside electrical routing features 936 may have a passivation layer 938 formed thereon. The passivation layer may protect the landing pads from oxidation and from trace metal and moisture contamination. In embodiments, passivation layer 938 may have openings at the locations of the landing pads that may have a surface finish 940 formed therein. In embodiments, the surface finish may be a solder compatible surface finish. Suitable surface finishes include, but are not limited to: electroless cobalt phosphide (CoP)/immersion gold (Au); electroless cobalt tungsten phosphide (CoWP)/immersion Au; electroless nickel phosphide (NiP)/immersion Au; electroless NiP/electroless palladium (Pd)/immersion Au; electroless tin (Sn); electroless NiP/electroless Sn; electroless CoWP/electroless Sn; electroless copper (Cu)/ electroless CoP/immersion Au; electroless Cu/electroless CoWP/immersion Au; electroless Cu/electroless; NiP/immersion Au; electroless Cu/electroless NiP/electroless Pd/immersion Au; electroless Cu/electroless Sn; electroless Cu/electroless NiP/electroless Sn; electroless Cu/electroless CoP/immersion Au; electroless Cu/electroless CoWP/electroless Sn. It will be appreciated that other surface finishes may also be suitable depending on chip-to-chip solder material(s) and/or chip-to-chip attachment methods that may be employed. In some embodiments, a die interconnect structure (e.g., bump) may be formed on top of, in addition to, or instead of the surface finish on top of one or more of the landing pads. The die interconnect structure (e.g., bump) may be formed from, for example, lead-tin (PbSn), Sn, tin-silver (SnAg), copper (Cu), indium (In), SnAgCu, SnCu, Au, etc. After block 820, the IC die may be detached from the temporary carrier wafer using any suitable, available wafer de-bonding equipment and processing. In other embodiments, the RDL 942 may include backside electrical routing features 936 consisting of a metallic material such as aluminum which are formed using a conventional subtractive etch-type process sequence.

Figure 10:
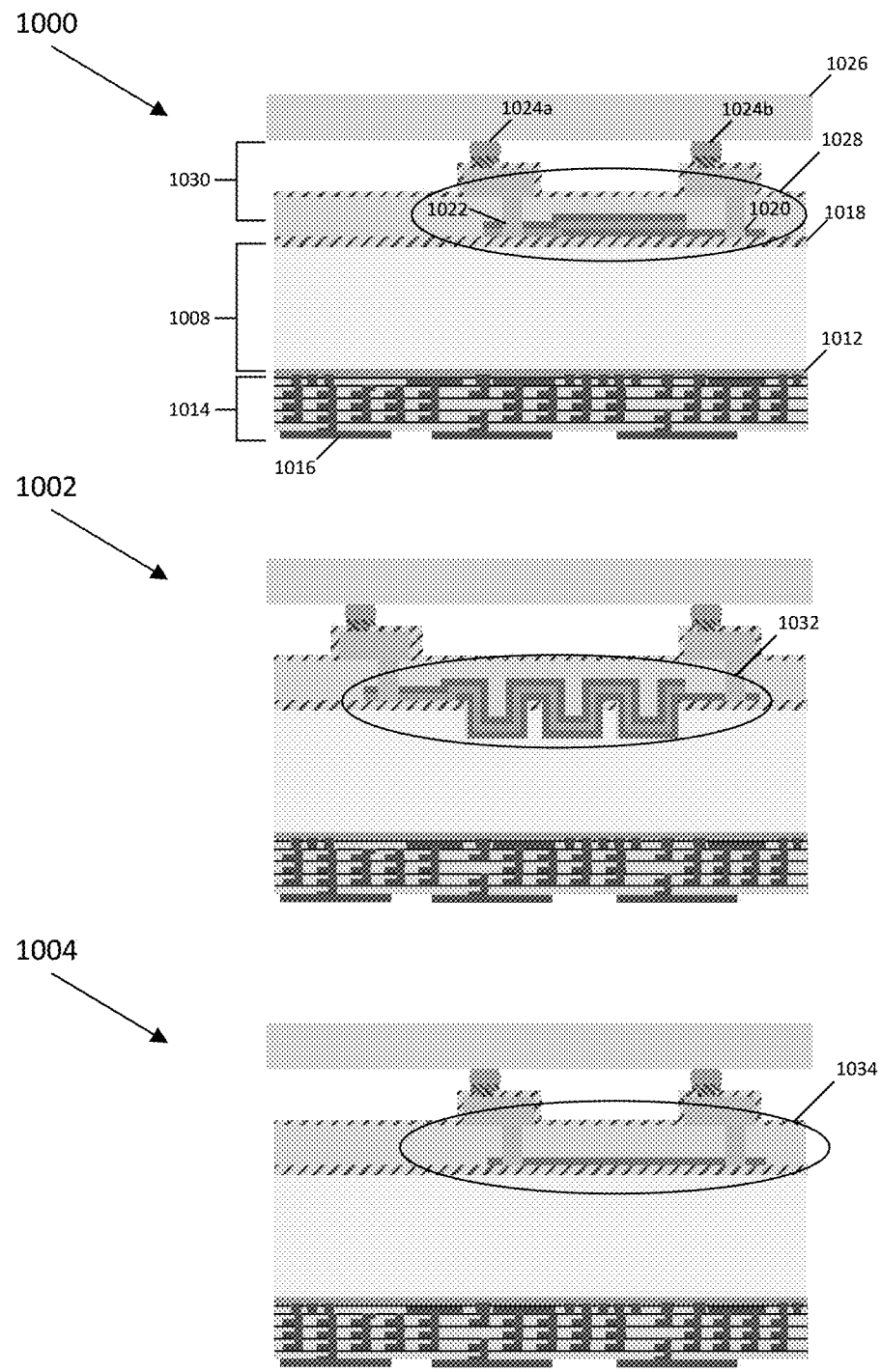
FIG. 10 illustrates various cross-section views of an integrated circuit die, in accordance with various embodiments of the present disclosure.

FIG. 10 illustrates various cross-section views of an integrated circuit die, in accordance with various embodiments of the present disclosure. In the first embodiment, IC die 1000 is depicted. IC die 1000 may include semiconductor substrate 1008. IC die 1000 may have an electrically insulative layer 1018 disposed on a backside of semiconductor substrate 1008. Electrically insulative layer 1018 may comprise any suitable material including, silicon nitride (SiN) or silicon carbide (SiC), for example. IC die 1000 may also include a plurality of active components (e.g., those depicted by layer 1012) disposed on an active side of semiconductor substrate 1008. In embodiments, one or more layers of electrically insulative material (e.g., layers 1014) may be disposed on the active side of the semiconductor substrate 1008. The one or more layers of electrically insulative material may, as depicted, encapsulate the plurality of active components. In embodiments, the one or more layers of electrically insulative material may include electrical routing features disposed therein. In addition, a plurality of die interconnect structures (e.g., die interconnect structure 1016) may be disposed in the one or more layers of the electrically insulative material. In embodiments, the electrical routing features may be configured to electrically couple the die interconnect structures with the plurality of active components. In some embodiments, IC die 1000 may have a metal-insulator-metal (MIM) capacitor 1028 formed thereon. MIM capacitor 1028 may be formed as discussed above in reference to FIGS. 2-4. The MIM capacitor 1028 may have electrical connections formed at 1020 and 1022 on terminals of first and second metal layer, respectively, with first and second interconnect structures, respectively disposed in one or more backside redistribution layers (RDLs) 1030. Electrical connections may be configured to route electrical signals between a second die 1026 and MIM capacitor 1028 by way of die interconnect structures 1024a and 1024b.

IC die 1002 depicts a similar configuration to that of IC die 1000; however, MIM capacitor 1028 has been replaced with trench capacitor 1032. Such a trench capacitor may be formed as described above in reference to FIGS. 5-7. IC die 1004, again, depicts a similar configuration to that of IC die 1000; however, MIM capacitor 1028 has been replaced with thin film resistor 1034. Such a thin film resistor may be formed as described above in reference to FIGS. 8 and 9.

Figure 11:
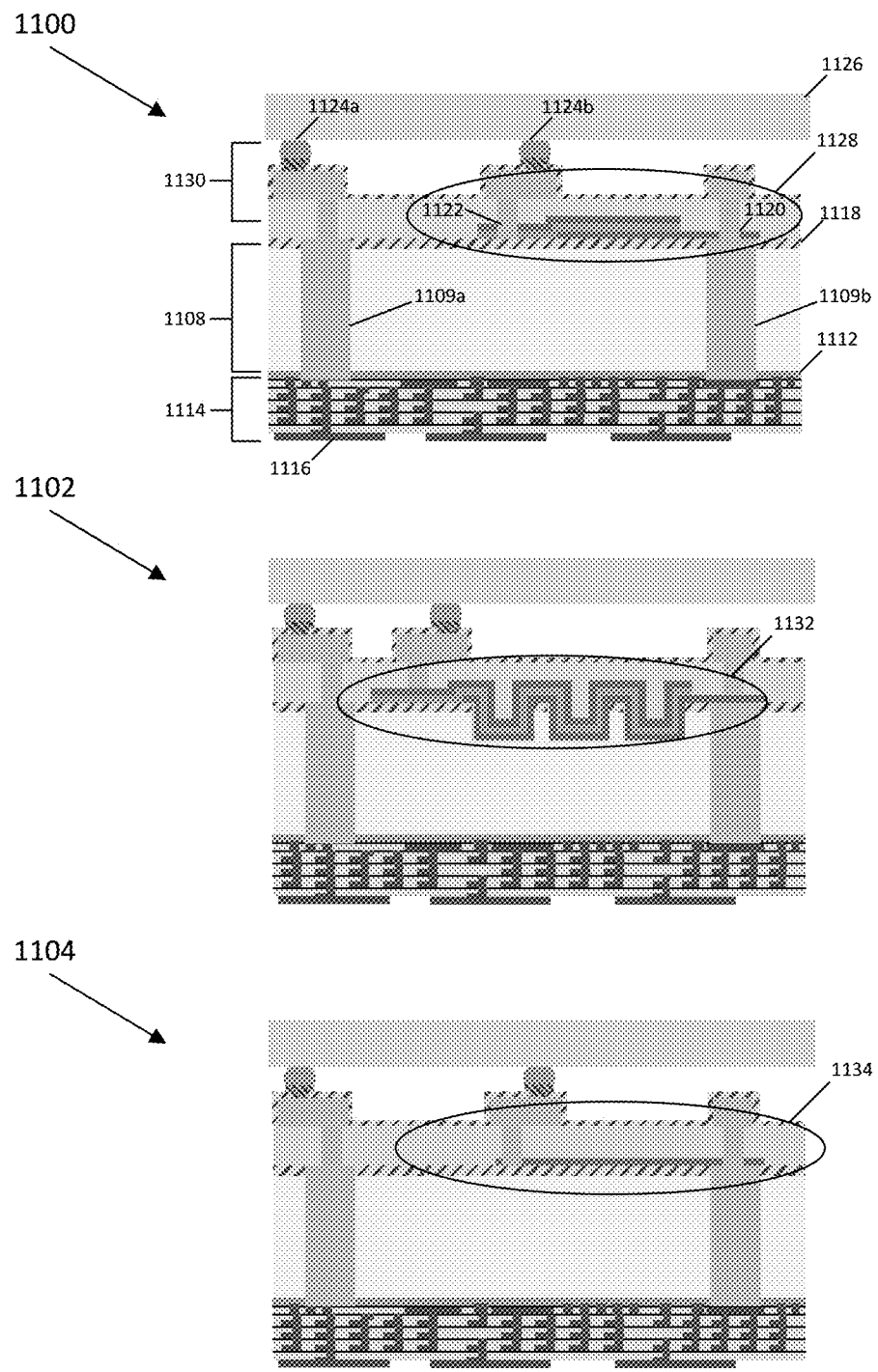
FIG. 11 illustrates various cross-section views of an integrated circuit die, in accordance with various embodiments of the present disclosure.

FIG. 11 illustrates various cross-section views of an integrated circuit die, in accordance with various embodiments of the present disclosure. In the first embodiment, IC die 1100 is depicted. IC die 1100 may include semiconductor substrate 1108. In some embodiments, IC die 1100 may include a plurality of through-substrate vias (TSVs) (e.g., TSVs 1109a and 1109b) disposed in semiconductor substrate 1108. The TSVs may be configured to route electrical signals between an active side of semiconductor substrate 1108, depicted here as the bottom of semiconductor substrate 1108 and the backside of semiconductor substrate, depicted here as the top of semiconductor substrate 1108. IC die 1100 may have an electrically insulative layer 1118 disposed on a backside of semiconductor substrate 1108. Electrically insulative layer 1118 may comprise any suitable material including silicon nitride (SiN) or silicon carbide (SiC), for example. IC die 1100 may also include a plurality of active components (e.g., those depicted by layer 1112) disposed on an active side of semiconductor substrate 1108. In embodiments, one or more layers of electrically insulative material (e.g., layers 1114) may be disposed on the active side of the semiconductor substrate 1108. The one or more layers of electrically insulative material may, as depicted, encapsulate the plurality of active components. In embodiments, the one or more layers of electrically insulative material may include electrical routing features disposed therein. In addition, a plurality of die interconnect structures (e.g., die interconnect structure 1116) may be disposed in the one or more layers of the electrically insulative material. In embodiments, the electrical routing features may be configured to electrically couple the die interconnect structures with the plurality of active components. In some embodiments, IC die 1100 may have a metal-insulator-metal (MIM) capacitor 1128 formed thereon. MIM capacitor 1128 may be formed as discussed above in reference to FIGS. 2-4. The MIM capacitor 1128 may have an electrical connection formed at 1122 on a terminal of a second metal layer with an interconnect structure disposed in one or more backside redistribution layers (RDLs) 1130. The MIM capacitor 1128 may also have an electrical connection formed at 1120 on a terminal of a first metal layer with TSV 1109b to electrically couple MIM capacitor 1128 with the active side of semiconductor substrate 1108. Electrical connections may be configured to route electrical signals between a second die 1126 and MIM capacitor 1128 by way of die interconnect structures 1124b. In addition, in the embodiment depicted, electrical signals may be routed between second die 1126 and the active side of semiconductor substrate 1108 through TSV 1109, by way of die interconnect structure 1124a.

IC die 1102 depicts a similar configuration to that of IC die 1100; however, MIM capacitor 1128 has been replaced with trench capacitor 1132. Such a trench capacitor may be formed as described above in reference to FIGS. 5-7. IC die 1104, again, depicts a similar configuration to that of IC die 1100; however, MIM capacitor 1128 has been replaced with thin film resistor 1134. Such a thin film resistor may be formed as described above in reference to FIGS. 8 and 9.

Figure 12:
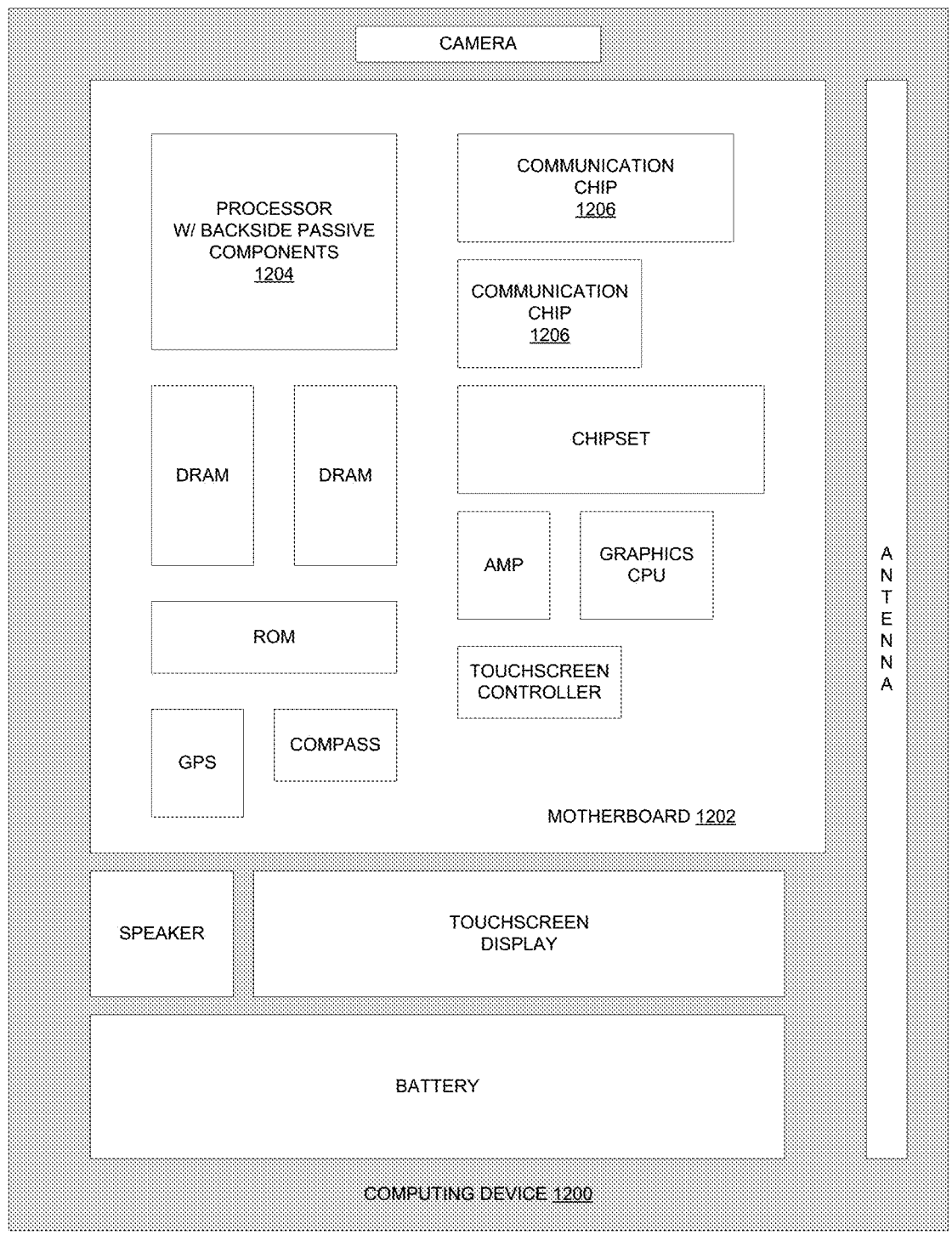
FIG. 12 schematically illustrates a computing device that includes an integrated circuit die, in accordance with various embodiments of the present disclosure.

Embodiments of the present disclosure may be implemented into a system using any suitable hardware and/or software to configure as desired. FIG. 12 schematically illustrates a computing device that includes an IC die as described herein, such as that depicted by FIGS. 1-11. The computing device 1200 may house a board such as motherboard 1202. The motherboard 1202 may include a number of components, including but not limited to a processor 1204 and at least one communication chip 1206. The processor 1204 may be physically and electrically coupled to the motherboard 1202. In some implementations, the at least one communication chip 1206 may also be physically and electrically coupled to the motherboard 1202. In further implementations, the communication chip 1206 may be part of the processor 1204.

Depending on its applications, computing device 1200 may include other components that may or may not be physically and electrically coupled to the motherboard 1202. These other components may include, but are not limited to, volatile memory (e.g., dynamic random access memory (DRAM)), non-volatile memory (e.g., read-only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1206 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 may be an IC die (e.g., IC die 106 of FIG. 1) incorporated into an IC assembly that may include a package substrate (e.g., package substrate 116 of FIG. 1). For example, the circuit board 124 of FIG. 1 may be a motherboard 1202 and the processor 1204 may be IC die 106. The processor 1204 and the motherboard 1202 may be coupled together using package-level interconnects as described herein. The term "processor" may refer to any device or portion of a device that processes electronic data from registers and/or memory to transform that electronic data into other electronic data that may be stored in registers and/or memory.

The communication chip 1206 may be an IC die (e.g., IC die 106) incorporated into an IC assembly that may include a package substrate (e.g., package substrate 116 of FIG. 1). In further implementations, another component (e.g., memory device or other integrated circuit device) housed within the computing device 1200 may be an IC die (e.g., IC die 106) incorporated into an IC assembly.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

According to various embodiments, the present disclosure describes a number of examples. Example 1 may include an integrated circuit (IC) die comprising: a semiconductor substrate; a plurality of active components disposed on a first side of the semiconductor substrate; a plurality of passive components disposed on a second side of the semiconductor substrate, wherein the second side is disposed opposite the first side, and wherein the plurality of passive components are selected from the group consisting of: capacitors or resistors.

Example 2 may include the subject matter of Example 1, further comprising a plurality of through-substrate vias (TSVs) disposed in the semiconductor substrate and configured to route electrical signals between one or more of the plurality of passive components and the first side of the semiconductor substrate.

Example 3 may include the subject matter of Example 1, further comprising: one or more layers of electrically insulative material disposed on the first side of the semiconductor substrate, wherein the one or more layers of electrically insulative material encapsulate the plurality of active components; a plurality of die-level interconnects disposed in the one or more layers of the electrically insulative material; and electrical routing features disposed in the one or more layers of electrically insulative material, wherein the electrical routing features are configured to electrically couple the die-level interconnects with the plurality of active components.

Example 4 may include the subject matter of Example 3, wherein the one or more layers of electrically insulative material are one or more first layers of electrically insulative material, the electrical routing features are first electrical routing features, the IC die further comprising: one or more redistribution layers (RDLs) disposed on the second side of the semiconductor substrate, wherein the one or more redistribution layers include: one or more second layers of electrically insulative material disposed on the second side of the semiconductor substrate, wherein the one or more second layers of electrically insulative material encapsulate the plurality of passive components; a plurality of input/output (I/O) interconnect structures disposed in the one or more second layers of the electrically insulative material; and second electrical routing features disposed in the one or more second layers of electrically insulative material, wherein the second electrical routing features are configured to electrically couple the plurality of I/O interconnect structures with the plurality of passive components.

Example 5 may include the subject matter of Example 1, wherein the plurality of passive components comprise a plurality of metal-insulator-metal (MIM) capacitors, wherein each of the plurality of MIM capacitors include a first metal layer, a capacitor dielectric layer disposed on the first metal layer, and a second metal layer disposed on the capacitor dielectric layer.

Example 6 may include the subject matter of Example 1, wherein the plurality of passive components comprise a plurality of trench capacitors, wherein each of the plurality of trench capacitors include a first metal layer disposed on one or more trenches formed in the semiconductor substrate, a capacitor dielectric layer disposed on the first metal layer, and a second metal layer disposed on the capacitor dielectric layer.

Example 7 may include the subject matter of either of Examples 5 or 6, wherein the first and second metal layers are respectively electrically coupled with first and second interconnect structures disposed in one or more redistribution layers (RDLs) that are disposed on the second side of the semiconductor substrate.

Example 8 may include the subject matter of either of Examples 5 or 6, wherein the first metal layer is electrically coupled with a TSV disposed in the semiconductor substrate, wherein the TSV electrically couples the first side of the semiconductor substrate with the second side of the semiconductor substrate.

Example 9 may include the subject matter of Example 8, wherein the second metal layer is electrically coupled with an electrical routing structure of the IC die, wherein the electrical routing structure is selected from the group consisting of: an additional TSV disposed in the semiconductor substrate, wherein the additional TSV electrically couples the first side of the substrate with the second side of the semiconductor substrate; or an interconnect structure disposed in one or more redistribution layers (RDLs) that are disposed on the second side of the semiconductor substrate.

Example 10 may include the subject matter of Example 1, wherein the plurality of passive components comprise a plurality of thin film resistors wherein each thin film resistor includes a first terminal and a second terminal.

Example 11 may include the subject matter of Example 10, wherein the first and second terminal are respectively electrically coupled with first and second interconnect structures disposed in one or more redistribution layers (RDLs) that are disposed on the second side of the semiconductor substrate.

Example 12 may include the subject matter of Example 10, wherein the first terminal is electrically coupled with a TSV disposed in the semiconductor substrate, wherein the TSV electrically couples the first side of the semiconductor substrate with the second side of the semiconductor substrate.

Example 13 may include the subject matter of Example 12, wherein the second terminal is electrically coupled with an electrical routing structure of the IC die, wherein the electrical routing structure is selected from the group consisting of: an additional TSV disposed in the semiconductor substrate, wherein the additional TSV electrically couples the first side of the substrate with the second side of the semiconductor substrate; or an interconnect structure disposed in one or more redistribution layers (RDLs) that are disposed on the second side of the semiconductor substrate.

Example 14 may include the subject matter of Example 1, wherein the plurality of active components comprise transistors.

Example 15 may include the subject matter of Example 1, wherein the semiconductor substrate comprises a silicon wafer.

Example 16 may include a method of forming an integrated circuit (IC) die assembly comprising: providing a semiconductor substrate; forming a plurality of active components on a first side of the semiconductor substrate; forming a plurality of passive components on a second side of the semiconductor substrate, wherein the second side of the semiconductor substrate is disposed opposite the first side of the semiconductor substrate.

Example 17 may include the subject matter of Example 16, wherein the plurality of passive components are selected from the group consisting of: metal-insulator-metal (MIM) capacitors, and wherein forming the plurality of passive components includes: depositing a first metal layer on the second side of the semiconductor substrate; depositing a capacitor dielectric layer on the first metal layer; and depositing a second metal layer on the capacitor dielectric layer; and trench capacitors, wherein forming the plurality of passive components includes: forming one or more trenches in a surface of the second side of the semiconductor substrate; depositing a first metal layer on the one or more trenches; depositing a capacitor dielectric layer on the first metal layer; and depositing a second metal layer on the capacitor dielectric layer.

Example 18 may include the subject matter of Example 17, further comprising: forming one or more redistribution layers (RDLs) on the passive components, wherein the one or more RDLs include a plurality of interconnect structures, and wherein the one or more RDLs are formed to electrically couple a first and second interconnect structure of the plurality of interconnect structures with the first and second metal layers, respectively.

Example 19 may include the subject matter of Example 17, wherein the semiconductor substrate includes a TSV disposed therein that electrically couples the first side of the semiconductor substrate and the second side of the semiconductor substrate, and wherein the first metal layer is formed to electrically couple with the TSV.

Example 20 may include the subject matter of Example 17, wherein the second metal layer is formed to electrically couple with an electrical routing structure of the IC die, wherein the electrical routing structure is selected from the group consisting of: an additional TSV formed in the semiconductor substrate, wherein the additional TSV electrically couples the first side of the semiconductor substrate with the second side of the semiconductor substrate; or one or more redistribution layers (RDLs) formed on the second side of the semiconductor substrate having interconnect structures formed therein.

Example 21 may include the subject matter of Example 16, further comprising: depositing one or more layers of an electrically insulative material on the plurality of active components; forming electrical routing features in the one or more layers of electrically insulative material; and forming a plurality of die-level interconnect structures in a surface of the one or more layers of the electrically insulative material, wherein the plurality of die-level interconnect structures are electrically coupled with the plurality of active components via the electrical routing features.

Example 22 may include the subject matter of Example 21, wherein the electrically insulative material is first electrically insulative material, the electrical routing features are first electrical routing features, and further comprising: depositing one or more layers of second electrically insulative material on the plurality of passive components; forming electrical routing features in the one or more layers of second electrically insulative material; and forming a plurality of input/output (I/O) interconnect structures in the one or more layers of the second electrically insulative material, wherein the plurality of I/O interconnect structures are electrically coupled with one or more of the plurality of passive components via the electrical routing features.

Example 23 may include an integrated circuit (IC) package assembly comprising: an integrated circuit (IC) die having: a plurality of active components disposed on a first side of a semiconductor substrate; a plurality of passive components disposed on a second side of the semiconductor substrate, wherein the second side of the semiconductor substrate is disposed opposite the first side of the semiconductor substrate; a first plurality of input/output (I/O) interconnect structures electrically coupled with the plurality of active components; and a second plurality of I/O interconnect structures electrically coupled with the plurality of passive components; and a package substrate electrically coupled with the IC die, wherein the package substrate is configured to route electrical signals of the IC die.

Example 24 may include the subject matter of Example 23, wherein the IC die is a first IC die and further comprising a second IC die disposed on the second side of the semiconductor substrate, wherein the second IC die includes a third plurality of I/O interconnect structures coupled with the second plurality of I/O interconnect structures to route electrical signals between the first IC die and the second IC die.

Example 25 may include the subject matter of Example 23, wherein the passive components are selected from a group consisting of: metal-insulator-metal (MIM) capacitors; trench capacitors; and thin film resistors.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package assembly comprising:
   an integrated circuit (IC) die having:
      a plurality of active components disposed on a first side of a semiconductor substrate;
      a plurality of passive components disposed on a second side of the semiconductor substrate, wherein the second side of the semiconductor substrate is disposed opposite the first side of the semiconductor substrate, wherein the plurality of passive components comprise two or more trench capacitors, wherein each of the two or more trench capacitors include a first metal layer disposed on one or more trenches formed in the semiconductor substrate, a capacitor dielectric layer disposed on the first metal layer, and a second metal layer disposed on the capacitor dielectric layer, wherein the first metal layer is electrically coupled with a through-silicon via (TSV) in the semiconductor substrate, wherein the TSV electrically couples the first side of the semiconductor substrate with the second side of the semiconductor substrate;
      a first plurality of input/output (I/O) interconnect structures electrically coupled with the plurality of active components; and
      a second plurality of I/O interconnect structures electrically coupled with the plurality of passive components, wherein the second plurality of I/O interconnect structures includes an electrical routing structure electrically coupled to the second metal layer of at least one of the trench capacitors, wherein the electrical routing structure is selected from the group consisting of:
         an additional TSV disposed in the semiconductor substrate, wherein the additional TSV electrically couples the first side of the substrate with the second side of the semiconductor substrate; or
         an interconnect structure disposed in one or more redistribution layers (RDLs) that are disposed on the second side of the semiconductor substrate; and
   a package substrate electrically coupled with the IC die, wherein the package substrate is configured to route electrical signals of the IC die.

2. The IC package assembly of claim 1, wherein the IC die is a first IC die and further comprising a second IC die disposed on the second side of the semiconductor substrate, wherein the second IC die includes a third plurality of I/O interconnect structures coupled with the second plurality of I/O interconnect structures to route electrical signals between the first IC die and the second IC die.

3. The IC package assembly of claim 1, wherein the passive components further include one or more of:
   metal-insulator-metal (MIM) capacitors; or
   thin film resistors.

4. The IC package assembly of claim 1, wherein the IC die further comprises one or more layers of electrically insulative material disposed on the first side of the semiconductor substrate, wherein the one or more layers of electrically insulative material encapsulate the plurality of active components;

a plurality of die-level interconnects disposed in the one or more layers of the electrically insulative material; and electrical routing features disposed in the one or more layers of electrically insulative material, wherein the electrical routing features are configured to electrically couple the die-level interconnects with the plurality of active components.

5. The IC package assembly of claim 4, wherein the one or more layers of electrically insulative material are one or more first layers of electrically insulative material, the electrical routing features are first electrical routing features, and the IC die further comprising:

one or more redistribution layers (RDLs) disposed on the second side of the semiconductor substrate, wherein the one or more redistribution layers include:

one or more second layers of electrically insulative material disposed on the second side of the semiconductor substrate, wherein the one or more second layers of electrically insulative material encapsulate the plurality of passive components;

a plurality of input/output (I/O) interconnect structures disposed in the one or more second layers of the electrically insulative material; and second electrical routing features disposed in the one or more second layers of electrically insulative material, wherein the second electrical routing features are configured to electrically couple the plurality of I/O interconnect structures with the plurality of passive components.

6. The IC package assembly of claim 1, wherein the plurality of passive components further comprise a plurality of metal-insulator-metal (MIM) capacitors, wherein each of the plurality of MIM capacitors include a first metal layer, a capacitor dielectric layer disposed on the first metal layer, and a second metal layer disposed on the capacitor dielectric layer.

7. The IC package assembly of claim 6, wherein the first and second metal layers of each of the plurality of MIMs are respectively electrically coupled with first and second interconnect structures disposed in one or more redistribution layers (RDLs) that are disposed on the second side of the semiconductor substrate.

8. The IC package assembly of claim 1, wherein the plurality of passive components further comprise a plurality of thin film resistors wherein each thin film resistor includes a first terminal and a second terminal.

9. The IC package assembly of claim 8, wherein the first and second terminals are respectively electrically coupled with first and second interconnect structures disposed in one or more redistribution layers (RDLs) that are disposed on the second side of the semiconductor substrate.

10. The IC package assembly of claim 1, wherein the electrical routing structure is the additional TSV.

11. The IC package assembly of claim 1, wherein the electrical routing structure is the interconnect structure.

* * * * *